(12) United States Patent
Fuller

(10) Patent No.: US 8,228,099 B2
(45) Date of Patent: *Jul. 24, 2012

(54) SYSTEM FOR DETECTING A RESET CONDITION IN AN ELECTRONIC CIRCUIT

(75) Inventor: Jay Scott Fuller, Scotts Valley, CA (US)

(73) Assignee: Certicom Corp., Mississauga (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/106,688

(22) Filed: May 12, 2011

(65) Prior Publication Data

US 2011/0210770 A1    Sep. 1, 2011

Related U.S. Application Data

(63) Continuation of application No. 12/610,082, filed on Oct. 30, 2009, now Pat. No. 7,965,113.

(60) Provisional application No. 61/193,155, filed on Oct. 31, 2008.

(51) Int. Cl.
   *H03L 7/00* (2006.01)

(52) U.S. Cl. .................................. 327/142; 327/198

(58) Field of Classification Search .................. 327/142, 327/143, 198
See application file for complete search history.

(56) References Cited

U.S. PATENT DOCUMENTS

| | | | |
|---|---|---|---|
| 4,419,596 A | 12/1983 | Kikuchi | |
| 5,661,763 A | 8/1997 | Sands | |
| 6,097,228 A | 8/2000 | Fujisawa | |
| 6,236,249 B1 | 5/2001 | Choi | |
| 6,407,597 B1 | 6/2002 | Ishiwaki | |
| 6,879,193 B2 | 4/2005 | Okamoto | |
| 7,363,561 B2 | 4/2008 | Dietrich | |
| 7,400,179 B2* | 7/2008 | Lin | 327/143 |
| 2003/0202628 A1 | 10/2003 | Tester | |
| 2005/0253638 A1* | 11/2005 | Dietrich et al. | 327/198 |
| 2008/0122512 A1 | 5/2008 | Lin | |
| 2011/0074472 A1* | 3/2011 | Kawasaki | 327/143 |
| 2011/0241741 A1* | 10/2011 | Millendorf et al. | 327/143 |

OTHER PUBLICATIONS

International Search Report from corresponding PCT Application No. PCT/CA2009/001558; search completed Feb. 8, 2010.

* cited by examiner

*Primary Examiner* — Lincoln Donovan
*Assistant Examiner* — William Hernandez
(74) *Attorney, Agent, or Firm* — Novak Druce + Quigg LLP

(57) ABSTRACT

A system for detecting the assertion of a reset signal. A plurality of circuit elements is configurable by a reset signal to output a string of data values in a predetermined pattern. A comparator receives the string of data values and determines whether the string of data values matches the predetermined pattern. If so, the comparator generates an output signal indicative of a reset. In one embodiment, the output signal of the comparator can be used to automatically trigger a reset if the reset signal has not been asserted.

7 Claims, 3 Drawing Sheets

SYSTEM FOR DETECTING A RESET CONDITION IN AN ELECTRONIC CIRCUIT

CROSS-REFERENCE TO RELATED APPLICATIONS

This application is a continuation of U.S. application Ser. No. 12/610,082 filed Oct. 30, 2009, the contents of which are incorporated herein by reference.

TECHNICAL FIELD

The following relates generally to digital electronics.

BACKGROUND

Digital electronic circuitry is often integrated into a miniature electronic circuit, referred to as an integrated circuit or a "chip." A chip generally has a number of input and output pins, which are respectively used to feed input signals into the chip and to access the corresponding output signals. A common input pin on a chip is a reset pin, which typically drives a system-wide reset signal for setting or resetting many or all of the flip flops and other circuit elements to an initial default state.

When a chip is first powered up, the flip flops are initially in an undetermined state. Therefore, the reset pin is typically asserted upon power up to set the flip flops to their initial designated state. Commonly, the reset is also used to set the minimum functionality or features of the chip. For example, a chip may include one or more features that are not intended to be available to the user. Therefore, the reset signal ensures such features are disabled by appropriately conditioning the associated circuitry.

Typically, the reset signal acts to initialize the availability of all features upon reset. Thereafter, only features meant to be accessed by a particular user can be enabled or "turned on" by the user by asserting signals on the input pins, or by other means. Therefore, if a user is not intended to have access to a particular feature, for example if the user did not purchase the particular feature, or if the feature is meant for testing only, the ability to enable that feature is disabled by the reset signal. In this way, a single circuit can be manufactured having a plurality of features, but only a subset of these features may be made available to and enabled by a particular user.

However, there exists attacks on a chip in which the reset signal is prevented from being asserted. For example, the attacker may try to lift the reset pin, overdrive the reset pin, or otherwise prevent the reset from occurring. Such an attack may be used to try and enable a feature that was not intended to be available to the user. As explained above, when a digital circuit is initially powered up, the flip flops are in an undetermined state. Such un-reset flip flops generally have a 50% chance of powering up in either the one or zero state, although the likelihood that a particular flip flop powers up in one particular state depends on factors such as the flip flop design, the parasitic capacitance, and the physical properties of the flip flop. Additionally, the speed at which the power-on voltage ramps up, as well as other physical attributes that may be controllable, can also affect the flip flop's power up state. Therefore, if the reset is not asserted, particular features may be enabled that are not intended to be available.

BRIEF DESCRIPTION

Representative embodiments will now be described by way of example only with reference to the accompanying drawings, in which.

DETAILED DESCRIPTION

In general terms, there is disclosed a dedicated system for monitoring whether a reset signal has been asserted and outputting a confirmatory signal indicating accordingly. In one embodiment, the confirmatory signal can be used to trigger a reset signal if the system determines that a reset condition has not occurred.

Figure 1:
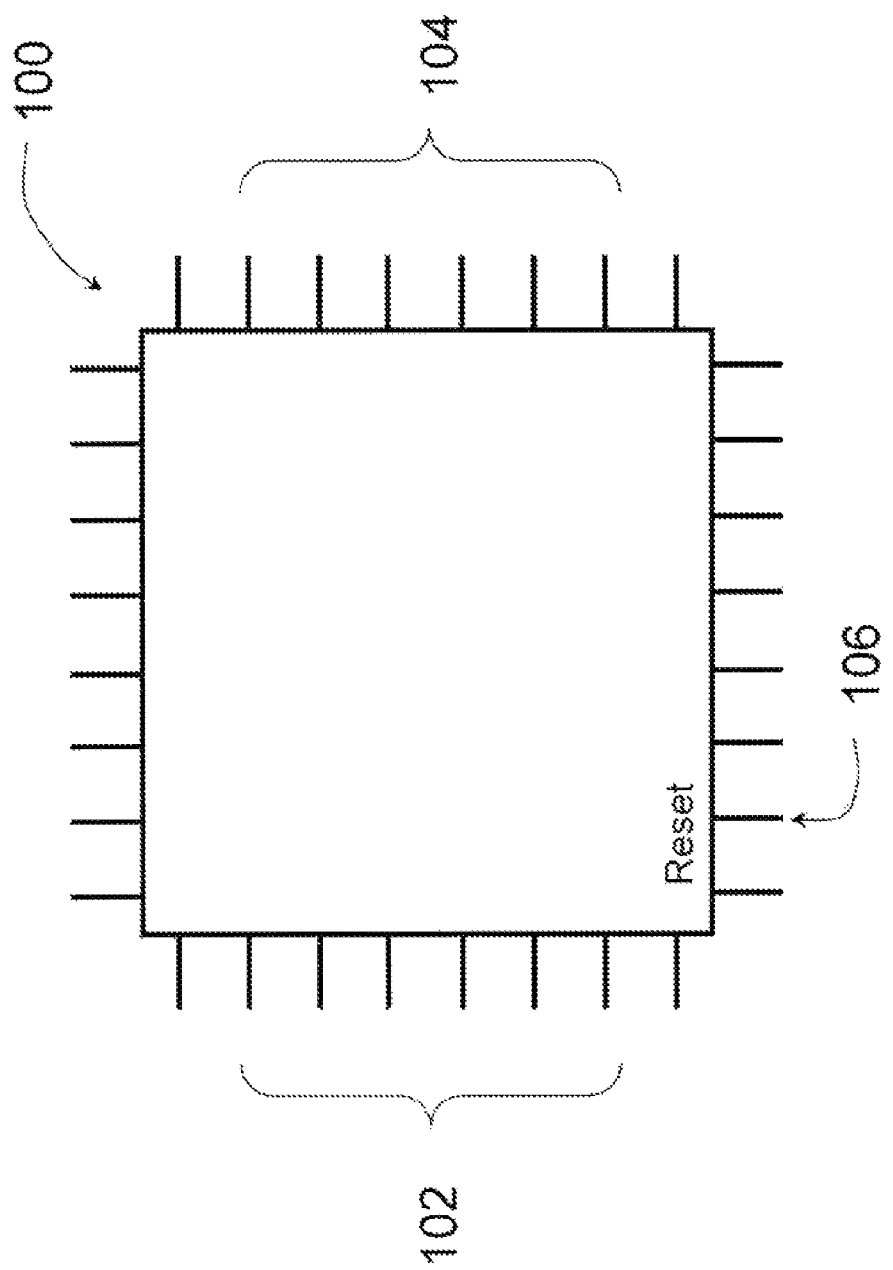
FIG. 1 is a schematic of an integrated circuit chip.

A specific embodiment will first be described with reference to FIGS. 1 and 2. Turning to FIG. 1, a chip 100 is shown having an input provided by a set of input pins 102 and an output provided by output pins 104. Signals are driven onto the input pins 102, which are processed by the circuitry in chip 100 to produce one or more data values on output pins 104. A reset pin 106 connects to a system-wide reset signal in chip 100 for setting all circuit elements to their initial default state. The reset signal is asserted on pin 106 upon power up, and it sets the minimum or desired chip features available to the user.

Figure 2:
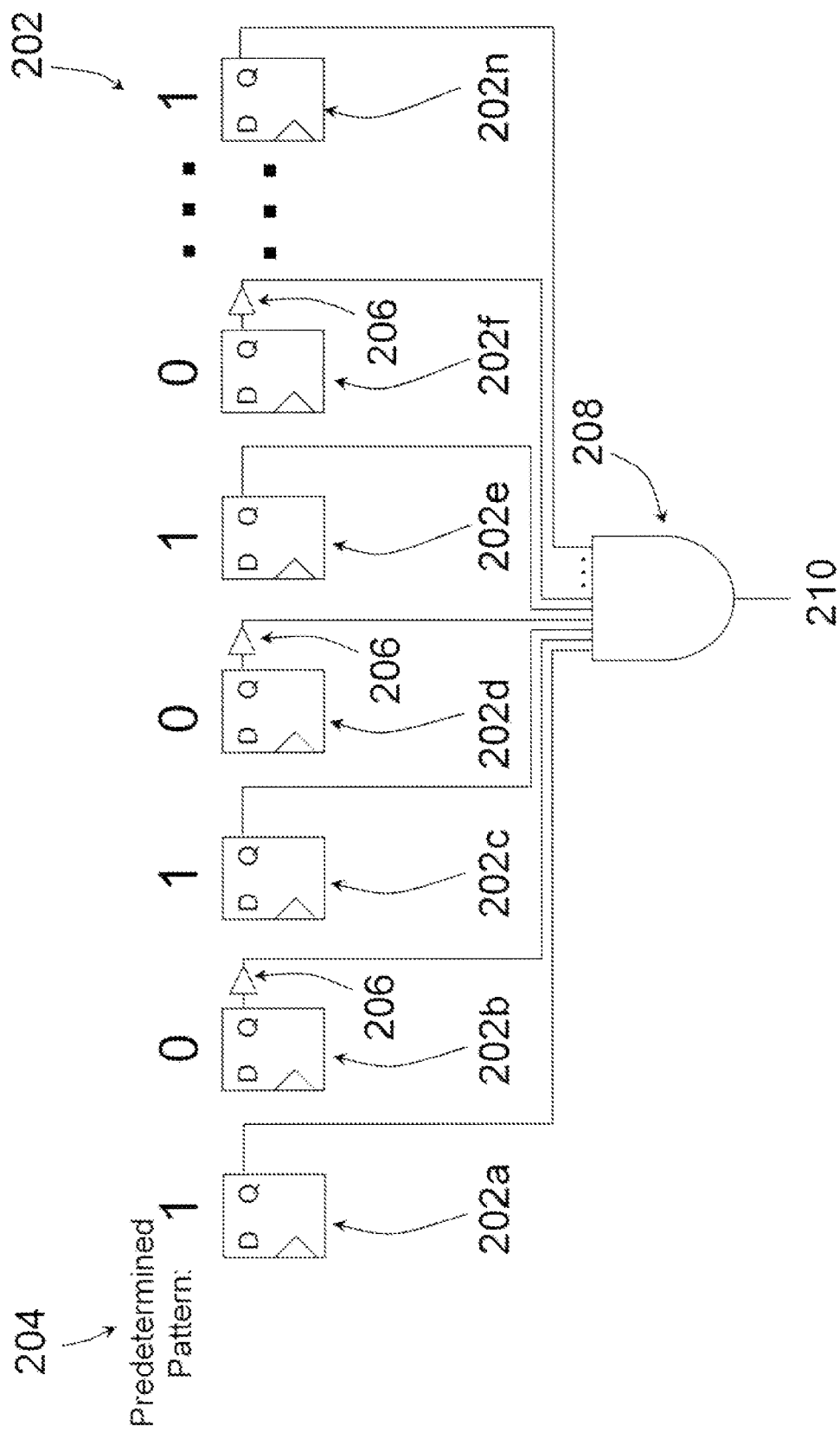
FIG. 2 is a schematic of circuit elements for implementing a specific embodiment of reset detection circuitry.

As shown in FIG. 2, within chip 100 there is a dedicated group 202 of flip flops 202a-n that are used for detecting the assertion of the reset signal. The subscript 'n' designates an arbitrary finite number. For example, in an embodiment in which 128 flip flops are utilized, n is equal to 128. In the embodiment shown in FIG. 2, D type flip flops are shown; however, it will be appreciated that other types of flip flops may instead be utilized.

The reset signal driven onto pin 106 is configured to set the contents of each flip flop 202a-n to a predetermined value, either to a one or a zero. Therefore, when the reset signal is asserted, the group 202 of flip flops 202a-n produces a string of data values in a predetermined pattern 204.

The reset signal can be asynchronous or synchronous. For example, in an embodiment in which the reset signal is asynchronous, during application of the reset signal, a signal is applied to produce a predetermined value, either a one or a zero, at the Q output of each flip flop 202a-n. In an embodiment in which the reset signal is synchronous, a predetermined value, either a zero or a one, is applied to the D input of each flip flop 202a-n with highest priority. When the synchronous reset signal is applied, a clock is also provided to cause the Q output of each flip flop 202a-n to obtain the predetermined value that is applied to the D input. When the synchronous reset signal is inactive, the Q output of each flip flop 202a-n is fed back into its D input in order to maintain its state.

Whether the reset signal is asynchronous or synchronous, when it is asserted, each flip flop 202a-n is loaded with a predetermined value and therefore the group 202 of flip flops 202a-n outputs the string of data values in a predetermined pattern 204. For example, in the embodiment shown in FIG. 2, this predetermined pattern 204 is an alternating string of ones and zeros. If reset signal on pin 106 is not asserted, as is intended during the powering of the chip 100, each flip flop 202a-n will power up to an undetermined or arbitrary state. That is, the contents of each flip flop 202a-n will arbitrarily take on a value of one or zero, and therefore group 202 will output a string of data values in an arbitrary pattern.

It is preferred that the predetermined pattern 204 be chosen to include an approximately equal number of ones and zeros, and that all flip flops 202a-n are of the same library cell. This way, if each flip flop 202a-n has an equal likelihood of powering up to a one or a zero, the probability of the flip flops arbitrarily powering up to predetermined pattern 204 is only one in $2^n$ (e.g., one in $2^{128}$, assuming 128 flip flops), which is extremely low when n is large. Alternatively, if the library cell has a "power on" affinity biased towards one or biased toward zero, it is even less probable that the arbitrary pattern will be equal to predetermined pattern 204.

Logic elements are placed at the output of the flip flops 202a-n to modify the string of data values and produce a set of signals that have a common digital value when the reset signal is asserted. Specifically, in the embodiment in FIG. 2, each flip flop 202a-n that is configured to be set to a zero by an assertion of the reset signal has an inverter 206 placed at its output. The predetermined pattern 204 is assumed to be an alternating string of ones and zeros, and therefore an inverter 206 is placed at the output of every other flip flop 202b, 202d, 202f, . . . , etc. The output of each inverter 206, and the output of each flip flop without an inverter, is then fed to an input of a comparator comprising an AND gate 208. Accordingly, the signal at the output 210 of AND gate 208 will be one if and only if group 202 exhibits predetermined pattern 204. The one signal is used as a confirmatory signal that a reset condition has been attained.

In use, if the reset signal on pin 106 is asserted as intended upon power up, flip flops 202a-n will be configured by the reset signal to output a string of data values in predetermined pattern 204. The output 210 of AND gate 208 will therefore be one, indicating a reset condition has been attained. However, if an attacker prevents a reset signal from being asserted during power up, each flip flop 202a-n will power up to an arbitrary value, which with large probability will produce a string having an arbitrary pattern that does not match predetermined pattern 204. Accordingly, the output 210 of AND gate 208 will therefore be zero, indicating that a reset condition has not been attained.

Figure 3:
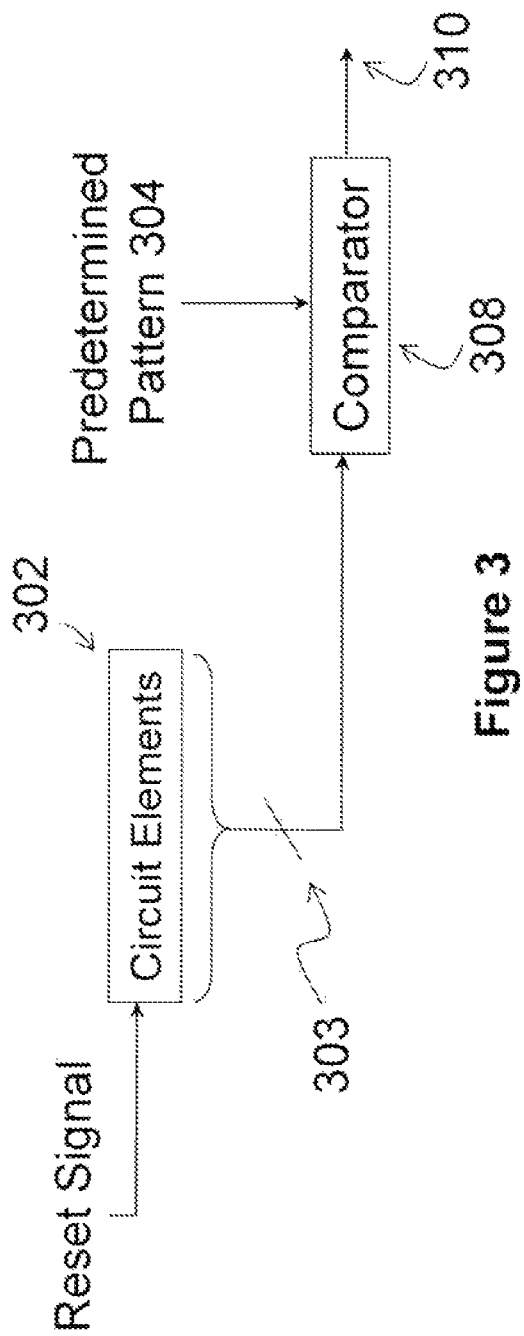
FIG. 3 is a general schematic representation of an embodiment of reset detection circuitry.

It will be appreciated that the specific circuit elements shown in FIG. 2 represent only one possible embodiment, and that the functionality achieved by such circuit elements may be generalized. A generalized embodiment of a system for detecting the assertion of a reset signal is shown in FIG. 3. A group 302 of circuit elements are configurable by a reset signal to output a string 303 of data values in a predetermined pattern 304. The circuit elements can be flip flops, volatile memory cells, or the like. The output value produced by each circuit element in group 302 is arbitrary upon power up if the reset signal is not asserted.

The string 303 of data values is fed to a comparator 308, which compares the pattern exhibited by the string 303 to predetermined pattern 304 and determines whether the string 303 matches the predetermined pattern 304. If the pattern exhibited by the string 303 matches predetermined pattern 304, comparator 308 determines that a reset condition has occurred and generates an output signal 310 that confirms attainment of a reset condition. Otherwise, if the pattern exhibited by the string 303 does not match predetermined pattern 304, comparator 308 determines that a reset condition has not occurred and generates an alternative output signal 310 accordingly.

It will be appreciated that many different arrangements of circuit elements may be utilized for achieving the detection circuitry of FIG. 3. For example, as discussed in relation to FIG. 2, the circuit elements 302 may be flip flops, the comparator 308 may be as simple as a single logic gate, and logic elements may be interposed between the output of the circuit elements 302 and the comparator 308 to produce at the input of the comparator 308 a string of data values having a particular pattern (e.g. all the same digital value of '1' or '0') when the reset signal is asserted. In an alternative embodiment, for example, the predetermined pattern 304 may instead be permanently stored in the chip 100 in the form of non-volatile memory or the like. In this case, the pattern exhibited by the string 303 of data values is compared by comparator 308 to the predetermined pattern 304 stored in non-volatile memory.

Advantageously, output signal 310 may be utilized by logic circuitry in chip 100 to act appropriately if a reset condition has not occurred. For example, in the embodiment shown in FIG. 4, output signal 310 is "ORed" at logic gate 402 with the signal applied to reset pin 106. In this embodiment, it is assumed that the system-wide reset signal is represented by a one, and that the output signal 310 from comparator 308 will be equal to one if the string 303 output by circuit elements 302 does not exhibit predetermined pattern 304 (i.e., if a reset condition does not occur).

Figure 4:
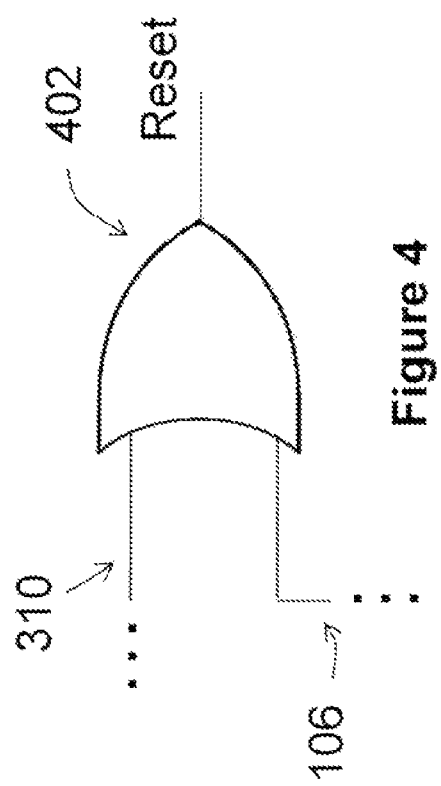
FIG. 4 is a schematic of one particular embodiment of circuitry for automatically asserting a reset.

With the provision of circuitry such as that shown in FIG. 4, if the reset pin 106 is not driven (i.e., if its input signal is zero), the string 303 will not exhibit predetermined pattern 304, and therefore the output signal 310 will have a value of one. This value is "ORed" with the input pin 106 by OR gate 402 and therefore a reset signal will be initiated and a reset condition will still occur. In this way, the system not only generates a signal indicative of attainment reset condition, but also automatically initiates or triggers a reset signal in the absence of such a signal. Consequently, even if an attacker tries to enable a feature not intended to be available by preventing a reset signal from being asserted through reset pin 106, the above-described system will detect the reset condition has not occurred and assert a reset signal itself.

Alternatively, if desired, the system of FIG. 3 may be used exclusively as the system-wide origin of a reset signal, instead of utilizing reset pin 106. In such an embodiment, the output of comparator 308 links directly to the system-wide reset signal. During power up, the string 303 initially defaults to an arbitrary pattern, which consequently triggers output signal 310 to effect a reset condition.

The system described in FIG. 3 is also useful in detecting and correcting a variety of disturbances that may upset volatile storage, such as flip flops, during operation of the chip 100. Such disturbances include power glitches, electromagnetic radiation, or other physical disturbances. If such a disturbance occurs, providing that the output value of at least one of the circuit elements from group 302 is affected, the comparator 308 will detect the change in the pattern exhibited by the output string 303, and output signal 310 will trigger a reset signal.

Advantageously, the system of FIGS. 2 to 4 also has the advantage that it requires only digital components, that is, no analog circuitry is required. Additionally, if the voltage supplied to the chip 100 is reduced in order to conserve power, a reset signal will not be triggered unless the voltage is lowered to the point where the circuit elements 302 cannot maintain their state information.

Although the invention has been described with reference to certain specific embodiments, various modifications thereof will be apparent to those skilled in the art without departing from the spirit and scope of the invention as outlined in the claims appended hereto.

What is claimed is:

1. A system for detecting a physical disturbance affecting a volatile storage of a computing device, said system comprising:
- a plurality of circuit elements for outputting a string of data values, said plurality of circuit elements outputting an arbitrary pattern of data values upon power up of said computing device; at least one output of said plurality of circuit elements operable to be affected by said physical disturbance;
- a comparator, including an input, said input for receiving said string of data values and determining whether said pattern of said string of data values changes, wherein said comparator detects said change in said pattern and generates a reset signal to reset said computing device.

2. The system of claim 1 wherein said comparator comprises a single logic gate for receiving said set of signals at said input and producing said reset signal.

3. The system of claim 1 wherein said plurality of circuit elements comprises flip flops.

4. The system of claim 1 wherein said system is within an integrated circuit and said reset signal provides a system-wide reset of said integrated circuit.

5. The system of claim 1 wherein said plurality of circuit elements comprises volatile memory, and wherein said predetermined pattern is stored in non-volatile memory accessible by said comparator.

6. The system of claim 1 wherein said disturbance is any one of a power glitch, electromagnetic radiation or voltage drop capable of upsetting volatile storage.

7. The system of claim 1 wherein said plurality of circuit elements are sensitive when a voltage level drops below a level required to maintain state information in said plurality of circuit elements.

* * * * *